(12) United States Patent
Shome et al.

(10) Patent No.: US 10,338,481 B2
(45) Date of Patent: Jul. 2, 2019

(54) POLARIZATION INDEPENDENT METROLOGY SYSTEM

(71) Applicant: ASML Holding N.V., Veldhoven (NL)

(72) Inventors: Krishanu Shome, Cheshire, CT (US); Justin Lloyd Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 15/766,427

(22) PCT Filed: Oct. 6, 2016

(86) PCT No.: PCT/EP2016/073820
§ 371 (c)(1),
(2) Date: Apr. 6, 2018

(87) PCT Pub. No.: WO2017/071925
PCT Pub. Date: May 4, 2017

(65) Prior Publication Data
US 2018/0299790 A1    Oct. 18, 2018

Related U.S. Application Data

(60) Provisional application No. 62/247,116, filed on Oct. 27, 2015.

(51) Int. Cl.
*G03F 9/00* (2006.01)
*G03F 7/20* (2006.01)

(52) U.S. Cl.
CPC ........ *G03F 7/70566* (2013.01); *G03F 9/7046* (2013.01); *G03F 9/7049* (2013.01);
(Continued)

(58) Field of Classification Search
None
See application file for complete search history.

(56) References Cited

U.S. PATENT DOCUMENTS

| 2004/0059540 A1 | 3/2004 | Matsumoto et al. |
| 2008/0094592 A1 | 4/2008 | Shibazaki |
| 2015/0109624 A1* | 4/2015 | Kreuzer ................ G03F 9/7069 356/508 |

FOREIGN PATENT DOCUMENTS

WO    WO 2016015955 A1    2/2016

OTHER PUBLICATIONS

International Search Report issued in related International Application No. PCT/EP2016/073820, dated Jan. 23, 2017; 6 pages.
(Continued)

*Primary Examiner* — Michelle M Iacoletti
(74) *Attorney, Agent, or Firm* — Sterne, Kessler, Goldstein & Fox P.L.L.C.

(57) ABSTRACT

A metrology system includes a radiation source that generates light, an optical modulation unit, a reflector, an interferometer, and a detector. The optical modulating unit temporally separates a first polarization mode of the light from a second polarization mode of the light. The reflector directs the light towards a substrate. The interferometer interferes the diffracted light from a pattern on the substrate, or reflected light from the substrate, and produces output light from the interference. The detector receives the output light from the interferometer. The first and second polarization modes of the output light are temporally separated at the detector.

16 Claims, 11 Drawing Sheets

(52) U.S. Cl.
CPC .......... *G03F 9/7065* (2013.01); *G03F 9/7069* (2013.01); *G03F 9/7088* (2013.01)

(56) References Cited

OTHER PUBLICATIONS

Written Opinion of the International Searching Authority issued in related International Application No. PCT/EP2016/073820, dated Jan. 23, 2017; 8 pages.

* cited by examiner ized by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

POLARIZATION INDEPENDENT METROLOGY SYSTEM

CROSS-REFERENCE TO RELATED APPLICATIONS

This application claims priority of U.S. Provisional Patent Application No. 62/247,116, which was filed on Oct. 27, 2015, and which is incorporated herein in its entirety by reference.

FIELD

The present disclosure relates to metrology systems that may be used, for example, in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use a metrology system for detecting positions of the alignment marks (e.g., X and Y position) and for aligning the substrate using the alignment marks to ensure accurate exposure from a mask. The metrology system may be used to determine a height of a wafer surface in the Z direction.

Alignment systems typically have their own illumination system. The signal detected from the illuminated alignment marks may be dependent on how well the wavelengths of the illumination system are matched to the physical or optical characteristics of the alignment marks, or physical or optical characteristics of materials in contact with or adjacent to the alignment marks. The aforementioned characteristics may vary depending on the processing steps used. Alignment systems may offer a narrow band radiation beam having a set of discrete, relatively narrow passbands in order to maximize the quality and intensity of alignment mark signals detected by the alignment system.

Alignment marks on a wafer tend to scramble polarization, thereby decreasing depth of modulation and negatively impacting performance of the polarization-sensitive alignment sensor. One solution to this problem is to include two different optical paths, each with its own interferometer. One polarization state of the radiation beam travels down one path, while an orthogonal polarization state of the radiation beam travels down the other path. Such an implementation is costly, and the alignment of the axes of the two interferometers is difficult to perform.

SUMMARY

Accordingly, there is a need for improving long term accuracy and stability of measurements in a metrology system.

According to an embodiment, a metrology system includes a radiation source that generates light, an optical modulating unit, a reflector, an interferometer, and a detector. The optical modulating unit temporally separates a first polarization mode of the light from a second polarization mode of the light. The reflector directs the light towards a substrate. The interferometer interferes the light that has been diffracted from a pattern on the substrate, or reflected from the substrate, and produces output light from the interference. The detector receives the output light from the interferometer. The first and second polarization modes of the output light are temporally separated at the detector.

In another embodiment, a metrology system includes a radiation source that generates light, a reflector, an optical modulating unit, an interferometer, and one or more detectors. The reflector directs the light towards a substrate. The optical modulating unit includes a polarization splitter that splits the light diffracted from a pattern on the substrate, or reflected from the substrate, into first polarized light having a first polarization mode and second polarized light having a second polarization mode, an optical rotator that receives the first polarized light and rotates the polarization of the first polarized light, and an optical coupler that combines the first rotated polarized light and the second polarized light to form combined light, such that the first polarization mode and the second polarization mode are spatially separated in a pupil plane. The interferometer receives the combined light, and produces output light from interference of the combined light. The one or more detectors receive the output light from the interferometer. The first and second polarization modes of the output light are spatially separated at the one or more detectors.

In yet another embodiment, a lithographic apparatus includes an illumination system designed to illuminate a pattern of a patterning device, a projection system that projects an image of the pattern onto a target portion of a substrate, and a metrology system. The metrology system includes a radiation source that generates light, an optical modulating unit, a reflector, an interferometer, and a detector. The optical modulating unit temporally separates a first polarization mode of the light from a second polarization mode of the light. The reflector directs the light towards a substrate. The interferometer interferes the light that has been diffracted from a pattern on the substrate, or reflected from the substrate, and produces output light from the interference. The detector receives the output light from the interferometer. The first and second polarization modes of the output light are temporally separated at the detector.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
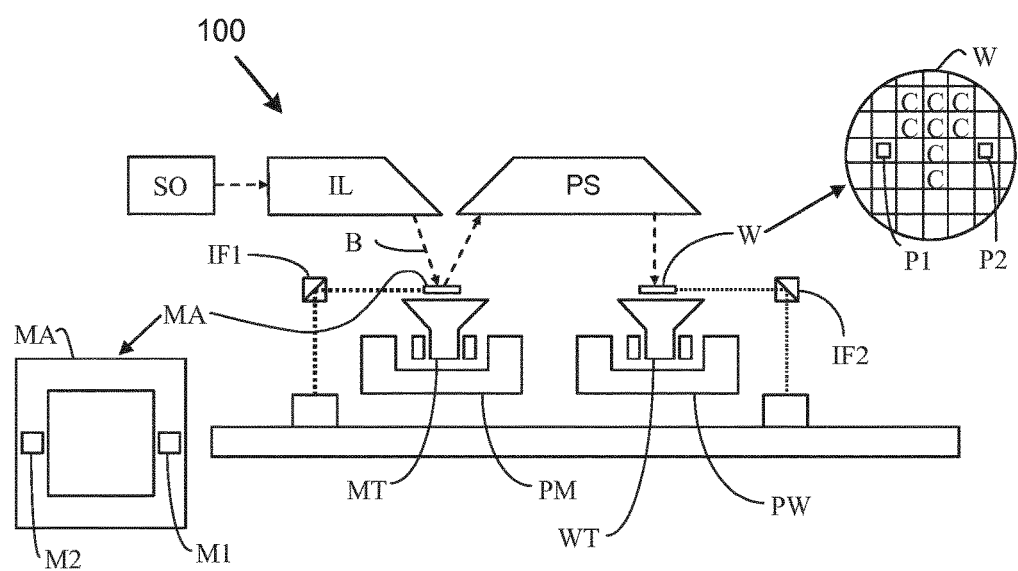
FIG. 1A is a schematic illustration of a reflective lithographic apparatus according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
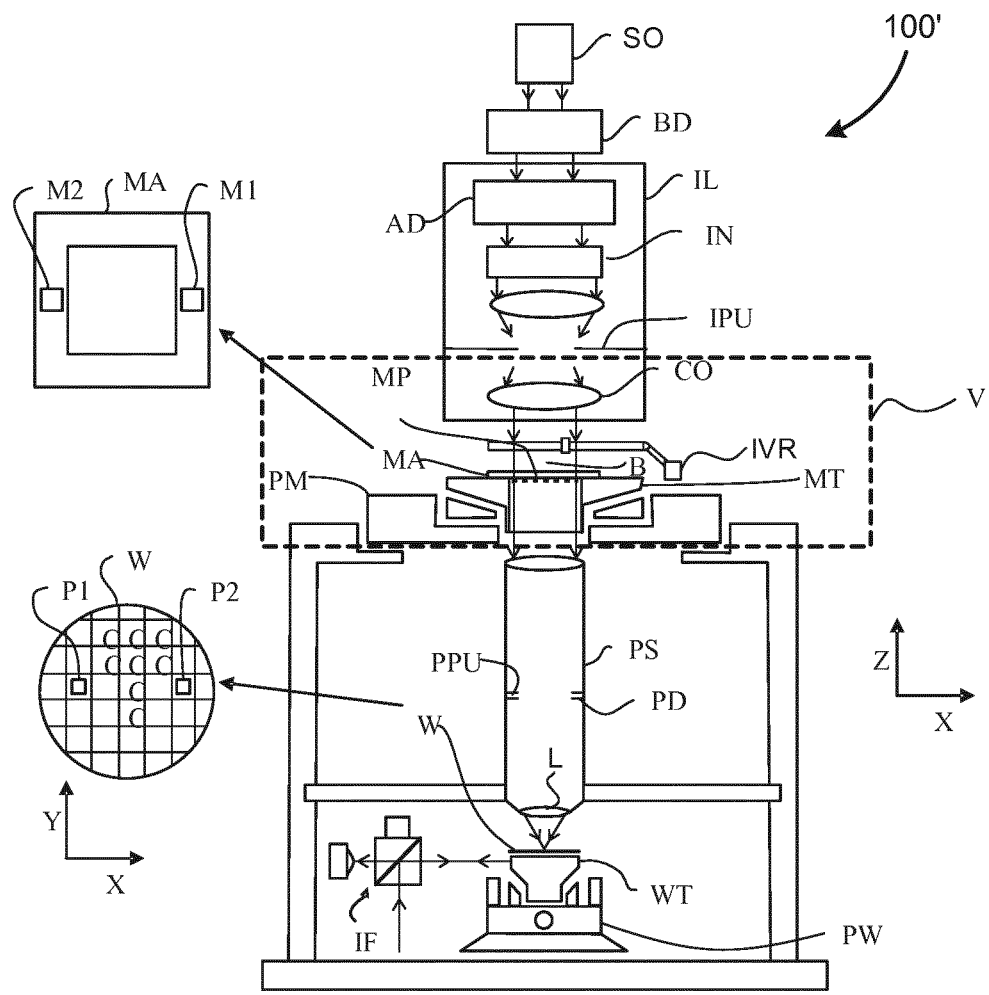
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
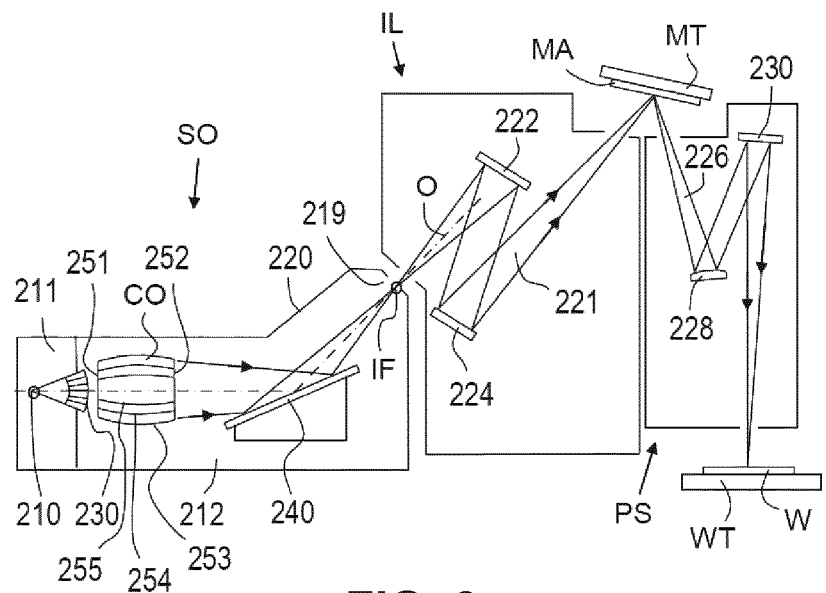
FIG. 2 is a more detailed schematic illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
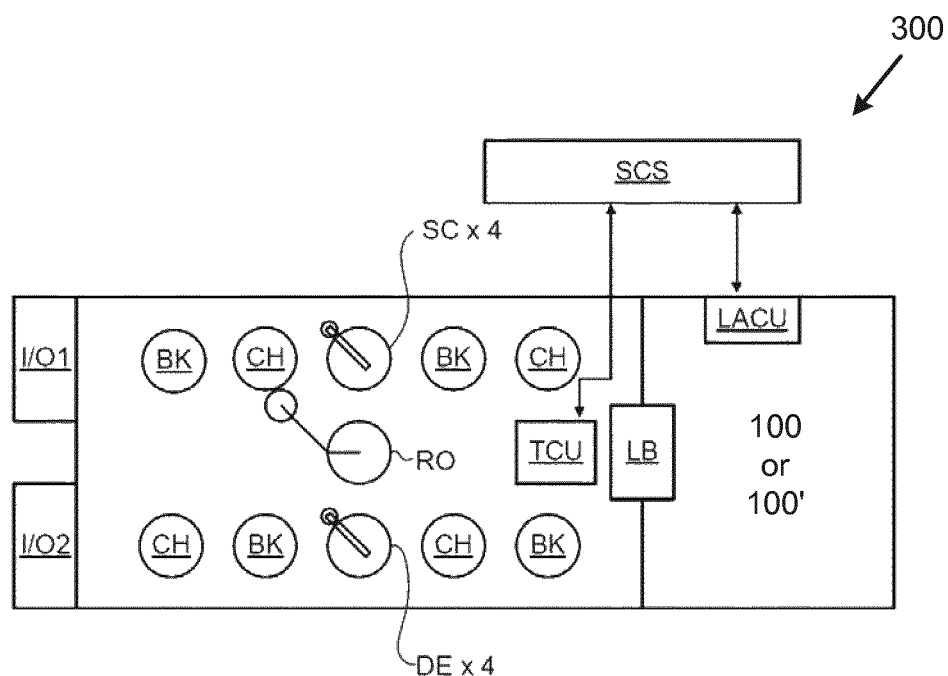
FIG. 3 is a schematic illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Metrology System

Figure 4:
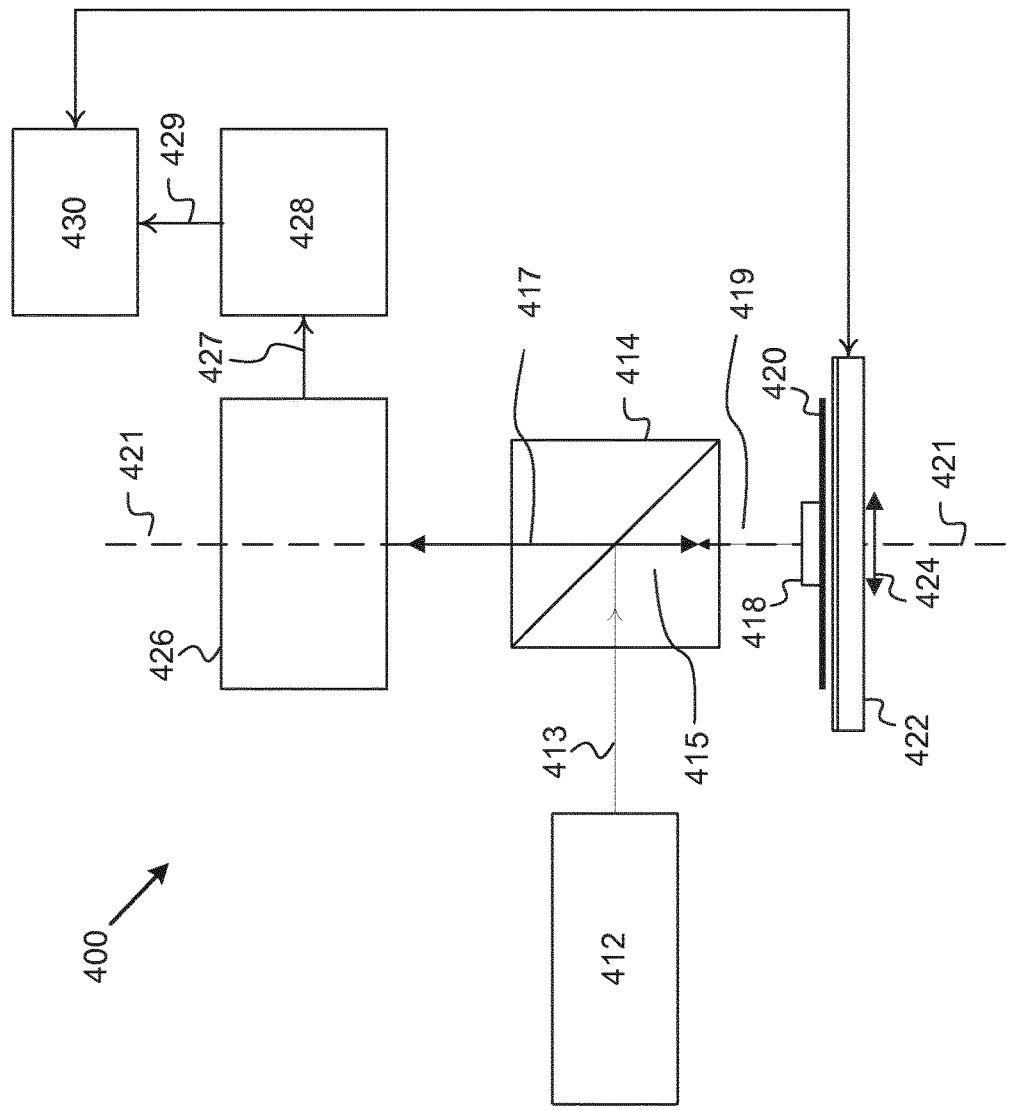
FIG. 4 is a schematic illustration of a metrology system, according to an embodiment.

FIG. 4 illustrates a schematic of a cross-sectional view of a metrology system 400 that can be implemented as a part of lithographic apparatus 100 or 100', according to an embodiment. In an example of this embodiment, metrology system 400 may be configured to align a substrate (e.g., substrate W) with respect to a patterning device (e.g., patterning device MA). Metrology system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, metrology system 400 may include an illumination system 412, a reflector 414, an interferometer 426, a detector 428, and an analyzer 430, according an example of this embodiment. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current metrology systems. And, as a result, the use of constant CWL values may improve long-term stability and accuracy of metrology systems (e.g., metrology system 400) compared to the current metrology systems.

Reflector 414 may be configured to receive radiation beam 413 and direct radiation beam 413 towards substrate 420 as beam 415, according an embodiment. Reflector 414 may be a mirror or dichromatic mirror. In one example, stage 422 is moveable along direction 424. Radiation beam 415 may be configured to illuminate an alignment mark or a target 418 located on substrate 420. In another example, radiation beam 415 is configured to reflect from a surface of substrate 420. Alignment mark or target 418 may be coated with a radiation sensitive film in an example of this embodiment. In another example, alignment mark or target 418 may have one hundred and eighty degree symmetry. That is, when alignment mark or target 418 is rotated one hundred and eighty degrees about an axis of symmetry perpendicular to a plane of alignment mark or target 418, rotated alignment mark or target 418 may be substantially identical to an un-rotated alignment mark or target 418.

As illustrated in FIG. 4, interferometer 426 may be configured to receive radiation beam 417. A radiation beam 419 may be refracted from an alignment mark or target 418, or reflected from a surface of substrate 420, and is received at interferometer 426 as radiation beam 417. Interferometer 426 comprises any appropriate set of optical-elements, for example, a combination of prisms that may be configured to form two images of alignment mark or target 418 based on the received radiation beam 417. It should be appreciated that a good quality image need not be formed, but that the features of alignment mark 418 should be resolved. Interferometer 426 may be further configured to rotate one of the two images with respect to the other of the two images one hundred and eighty degrees and recombine the two images interferometrically.

In an embodiment, detector 428 may be configured to receive the recombined image and detect an interference as a result of the recombined image when alignment axis 421 of metrology system 400 passes through a center of symmetry (not shown) of alignment mark or target 418. Such interference may be due to alignment mark or target 418 being one hundred and eighty degree symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. In another example, detector 428 is configured to receive the recombined image and detect an interference of light being reflected off a surface of substrate 420.

In a further embodiment, analyser 430 may be configured to receive signal 429 including information of the determined center of symmetry. Analyser 430 may be further configured to determine a position of stage 422 and correlate the position of stage 422 with the position of the center of symmetry of alignment mark or target 418. As such, the position of alignment mark or target 418 and consequently, the position of substrate 420 may be accurately known with reference to stage 422. Alternatively, analyser 430 may be configured to determine a position of metrology system 400 or any other reference element such that the center of symmetry of alignment mark or target 418 may be known with reference to metrology system 400 or any other reference element.

It should be noted that even though reflector 414 is shown to direct radiation beam 413 towards alignment mark or target 418 as radiation beam 415, the disclosure is not so limiting. It would be apparent to a person skilled in the relevant art that other optical arrangements may be used to obtain the similar result of illuminating alignment mark or target 418 on substrate 420 and detecting an image of alignment mark or target 418. Reflector 414 may direct the illumination in a direction normal to the surface of substrate 420, or at an angle.

Time Multiplexed Metrology Systems

FIGS. 5-8 illustrate optical metrology systems that separate different polarization states of the light in the time domain, according to various embodiments. The metrology systems may be alignment systems (e.g., measuring x-y position of features on a substrate) where the light is directed towards a substrate in substantially normal direction to a surface of the substrate, and the diffracted light is collected. In another example, the light may be directed at an angle above the substrate surface, and the diffracted light is collected. The metrology systems may also be height sensors (e.g., measuring z position of features on, or the surface of, the substrate. When used as height sensors, the metrology systems use light incident at an angle above the surface of the substrate and collect the reflected light rather than diffraction.

Some of the elements illustrated in FIGS. 5-8 are similar to those already described in FIG. 4 and include the same labels. As such, the bulk of the description of these embodiments will focus on the additional elements and signals provided in each embodiment. Although the s and p polarization states are used herein as an example, it should be understood that other polarization states may be used, and that the s and p polarization states may be switched. Other polarization states include X- and Y-linear polarization, or right- and left-handed circular polarization. According to an embodiment, the different polarization modes of the light are orthogonal to one another.

Figure 5:
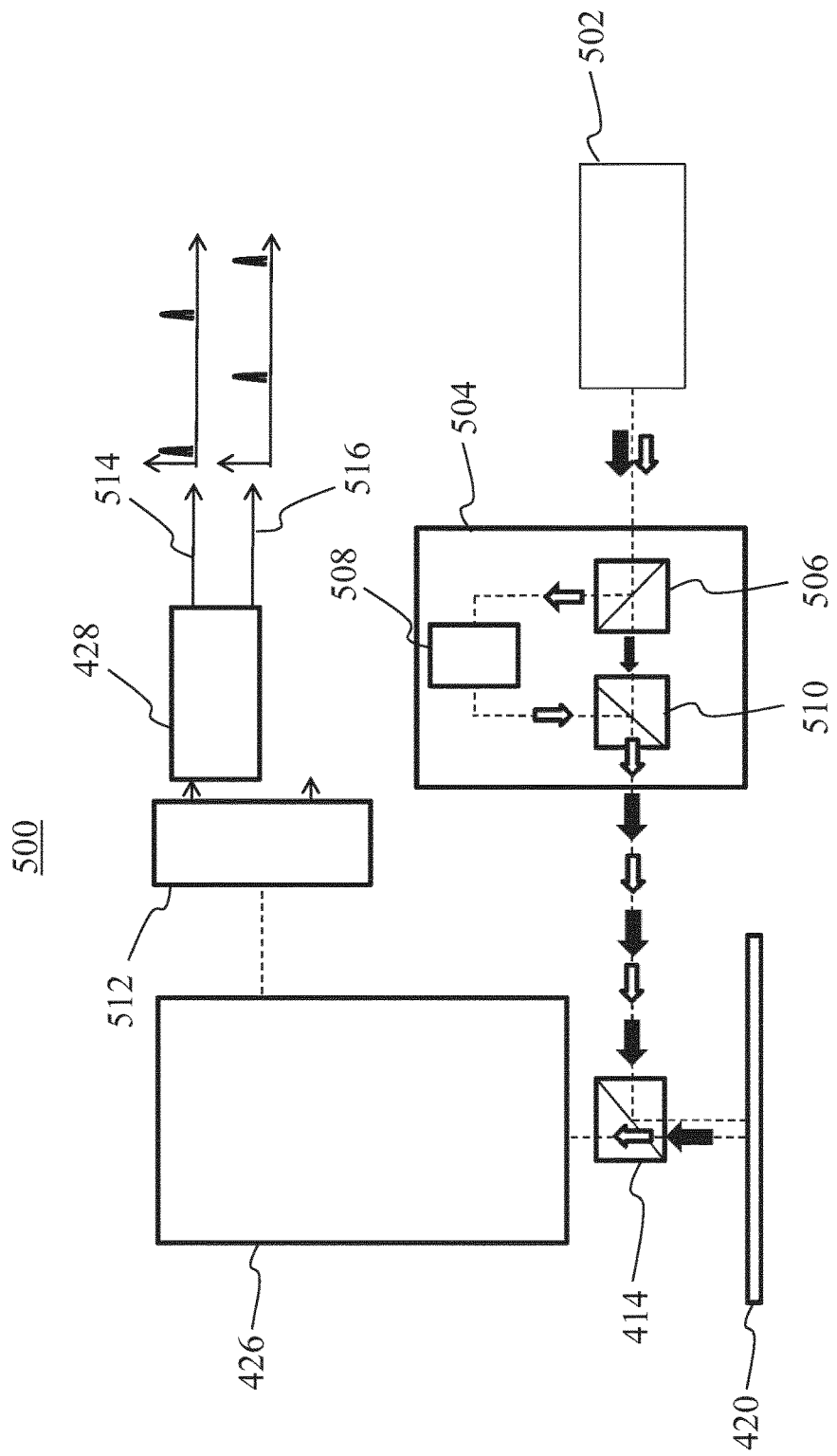
FIGS. 5-8 are schematic illustrations of time-multiplexed metrology systems, according to various embodiments.

FIG. 5 illustrates a schematic of a metrology system 500 that can be implemented as a part of lithographic apparatus 100 or 100', according to an embodiment. Metrology system 500 includes an illumination system 502, an optical modulation system 504, beam splitter 414, interferometer 426, a de-multiplexer 512 and detector 428. The dashed optical pathways between various elements of metrology system 500 may include free space optical components, such as lenses and mirrors, that help to guide the light. Light may also be directed along the optical pathways using one or more optical fibers.

Illumination system 502 may comprise a laser or bright LED source. The laser source may be a white laser source comprising a range of wavelengths in the visible spectrum. Other laser sources may be used that provide wavelengths in the near to mid-range infrared range. According to an embodiment, illumination system 502 provides pulsed illumination, such that the various pulses are separated in the time domain.

The light generated by illumination system 502 is received by optical modulation system 504, according to an embodiment. The light received is unpolarized (e.g., includes both s and p polarization states). The black arrows represent one polarization state while the white arrows represents the other polarization state. Before the light reaches optical modulation system 504, each pulse of light includes both polarization states as indicated by the arrows being one over the other.

Optical modulation system 504 includes a polarization beam splitter 506, a delay element 508, and a combiner 510, according to an embodiment. Polarization beam splitter 506 directs light having a first polarization (e.g., p polarized) down a first path towards combiner 510 and light having a second polarization (e.g., s polarized) down a second path towards delay element 508, as indicated by the white and black arrows in FIG. 5.

Delay element 508 is designed to receive the s-polarized light and cause a group delay in the s-polarized light, according to an embodiment. Delay element 508 may be a passive delay such as, for example, a fiber loop or arrangement of mirrors arranged to change a path-length of the s-polarized light as it traverses delay element 508. The length of the delay loop may be such that the s polarized pulses are delayed by half the time between adjacent pulses from illumination system 502. In another example, delay element 508 is an active component such as a semiconductor electro-, thermo-, or acousto-optical modulator. The applied modulation changes the delay of the s polarized light as it traverses the modulator.

Combiner 510 combines the p-polarized light with the delayed s-polarized light. Upon recombination, the pulses are now separated in the time domain based on their polarization. For example, s-polarized pulses alternate with p-polarized pulses in the time domain, as illustrated by the white arrows and black arrows following one after another along the optical path after the light has gone through combiner 510. Combiner 510 may include a spot mirror or other partially reflective mirror. When using optical fibers, combiner 510 may include an evanescent coupler.

The polarized light pulses are received at reflector 414. Reflector 414 is designed to direct the incoming light towards substrate 420. Reflector 414 may include a partially reflective mirror or a polarizing beam splitter. For example, the s and p polarized pulses directed towards substrate 420 generate a diffraction order respective of the polarization property of the substrate target marks. The polarized pulses diffract off of substrate 420 and back through reflector 414 to reach interferometer 426 which interferes the diffraction orders from the respective s and p pulses to generate signal pulses. Although reflector 414 is illustrated directing the incoming light substantially normal to the surface of substrate 420, in other embodiments, reflector 414 directs the light towards substrate 420 at an angle.

The output of interferometer 426 is received by de-multiplexer 512, according to an embodiment. De-multiplexer 512 may be implemented to separate out various spectral bands in the optical output, with each spectral band being routed to a different detector. Only one detector 428 is illustrated, but any number of detectors may be used for different spectral bands.

The different polarizations in the output light can be easily identified at detector 428, since the polarizations have been separated in the time domain. For example, signal 514 represents the s-polarized pulses while signal 516 represents the p-polarized pulses. The s-polarized pulses alternate in time with the p-polarized pulses as illustrated in the accompanying graphs. Note that these graphs are only exemplary. By being able to temporally separate the polarized states at detector 428, metrology system 500 does not need two interferometers (one for each polarization state).

Figure 6:
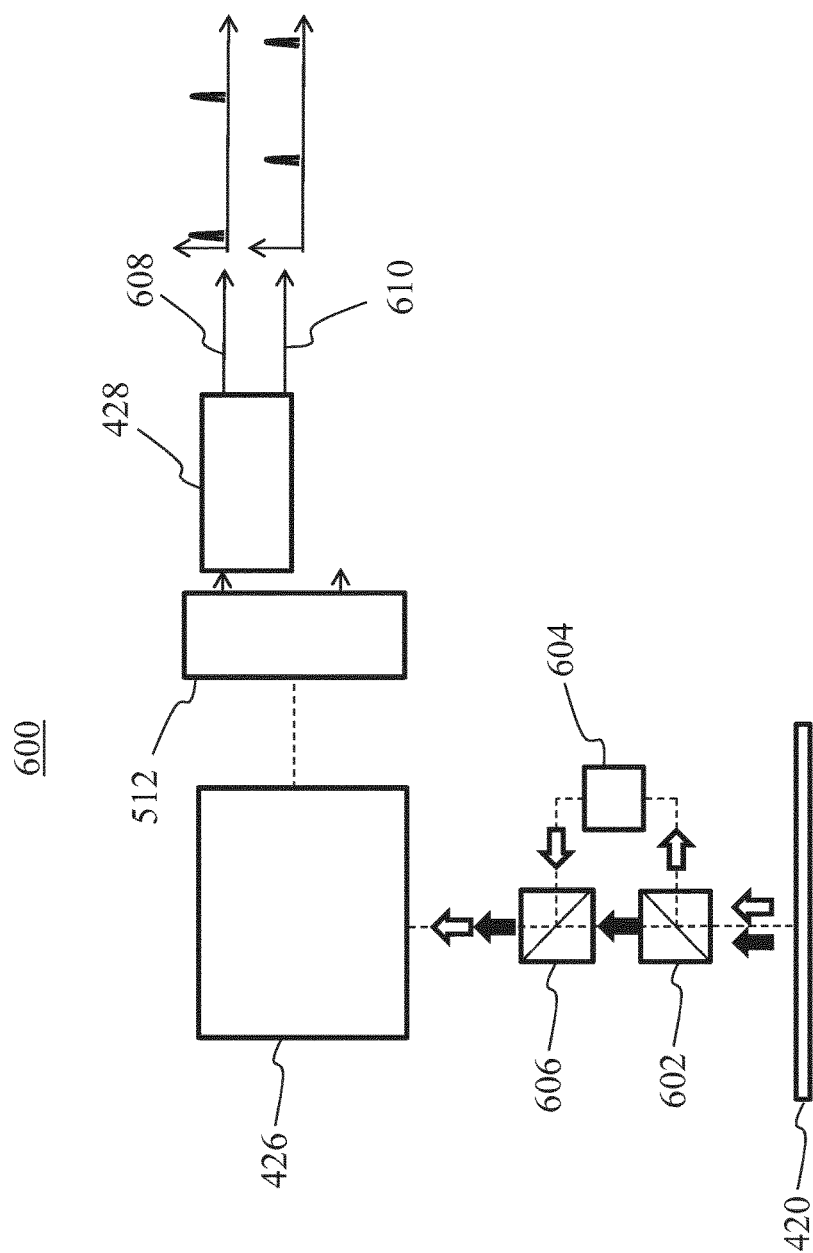

FIG. 6 illustrates a schematic of another metrology system 600 that can be implemented as a part of lithographic apparatus 100 or 100', according to an embodiment. Metrology system 600 is similar to metrology system 500, except that the polarization splitting and delay occur after the light has been diffracted or reflected from the surface of substrate 420. The light is generated and directed towards substrate 420 in a similar way to that illustrated in FIG. 4. Illumination system 412 and reflector 414 are not shown in FIG. 6 for clarity. The dashed optical pathways between various elements of metrology system 600 may include free space optical components such as lenses and mirrors that help to guide the light. Light may also be directed along the optical pathways using one or more optical fibers.

Pulsed light is diffracted or reflected from a target on the surface of substrate 420 and received by polarization beam splitter 602, according to an embodiment. Polarization beam splitter 602 may operate in substantially the same way as polarization beam splitter 506 from FIG. 5. Polarization beam splitter 602 directs light having a first polarization (e.g., p polarized) down a first path towards combiner 606 and light having a second polarization (e.g., s polarized) down a second path towards delay element 604, as indicated by the white and black arrows in FIG. 6.

Delay element 604 is designed to receive the s-polarized light and cause a group delay in the s-polarized light, according to an embodiment. Delay element 604 may be a passive delay such as, for example, a fiber loop or arrangement of mirrors arranged to change a path-length of the s-polarized light as it traverses delay element 604. The length of the delay loop may be such that the s polarized pulses are delayed by half the time between adjacent pulses from illumination system 604. In another example, delay element 604 is an active component such as a semiconductor electro-, thermo-, or acousto-optical modulator. The applied modulation changes the delay of the s polarized light as it traverses the modulator.

Combiner 606 combines the p-polarized light with the delayed s-polarized light. Upon recombination, the pulses are now separated in the time domain based on their polarization. For example, s-polarized pulses alternate with p-polarized pulses in the time domain, as illustrated by the white arrows and black arrows following one after another along the optical path after the light has gone through combiner 606. Combiner 606 may include a spot mirror or other partially reflective mirror. When using optical fibers, combiner 606 may include an evanescent coupler.

Interferometer 426 interferes the diffraction orders from the respective s and p pulses in the light received from combiner 606 to produce an output beam received by de-multiplexer 512. De-multiplexer 512 and detector 428 work in a similar way as described above in FIG. 5.

The different polarizations in the output light can be easily identified at detector 428, since the polarizations have been separated in the time domain. For example, signal 514 represents the s-polarized pulses while signal 516 represents the p-polarized pulses. The s-polarized pulses alternate in time with the p-polarized pulses as illustrated in the accompanying graphs. Note that these graphs are only exemplary. By being able to temporally separate the polarized states at detector 428, metrology system 600 does not need two interferometers (one for each polarization state).

Figure 7:
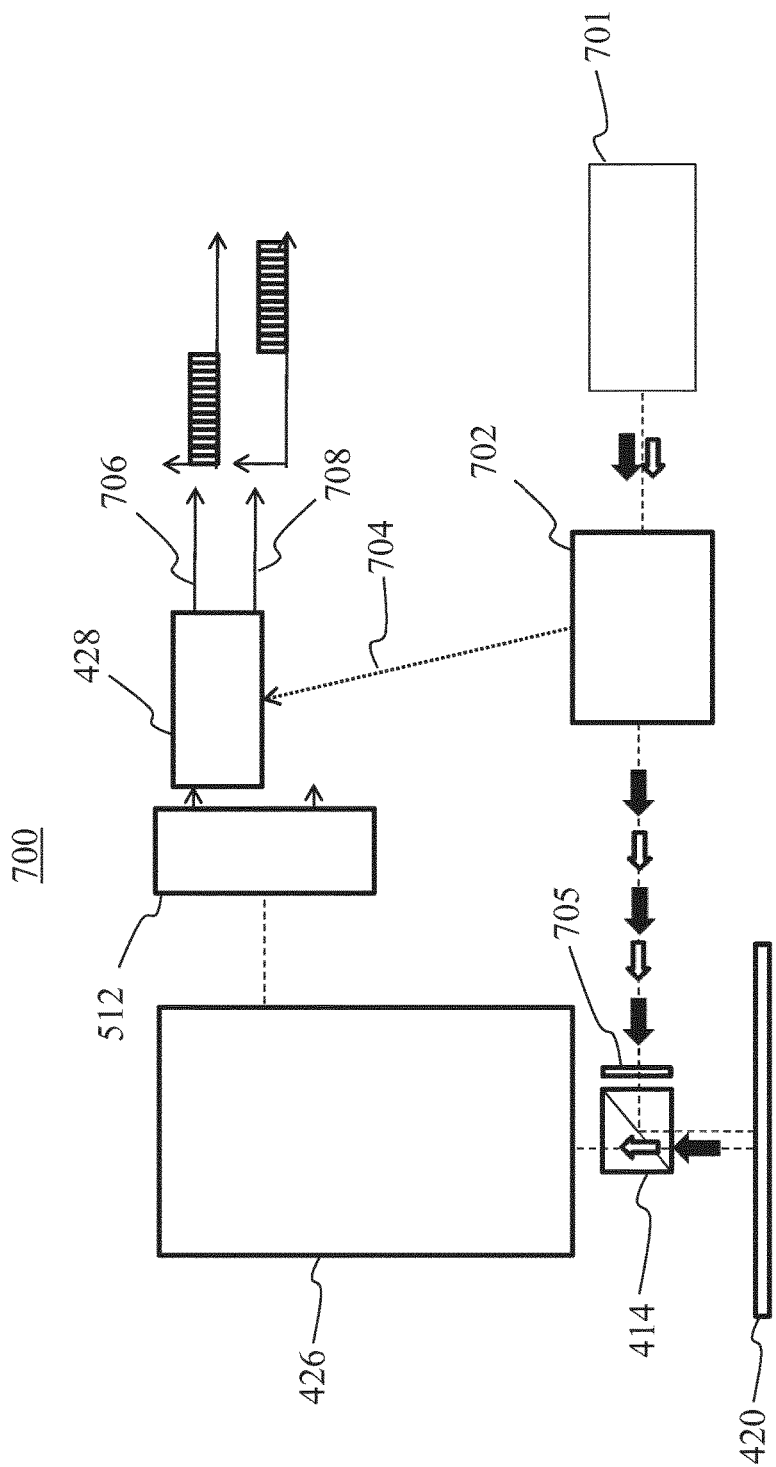

FIG. 7 illustrates a schematic of another metrology system 700 that can be implemented as a part of lithographic apparatus 100 or 100', according to an embodiment. Metrology system 700 is similar to metrology system 500, except that optical modulating system 504 is replaced with modulator 702. The dashed optical pathways between various elements of metrology system 700 may include free space optical components such as lenses and mirrors that help to guide the light. Light may also be directed along the optical pathways using one or more optical fibers.

Illumination system 701 may comprise a laser or bright LED source. The laser source may be a white laser source comprising a range of wavelengths in the visible spectrum. Other laser sources may be used that provide wavelengths in the near to mid-range infrared range. According to an embodiment, illumination system 701 provides continuous illumination.

The light from illumination system is received by modulator 702. Modulator 702 is a dynamic modulator including one or more electro-, thermo-, or acousto-optical modulators designed to modulate the incoming light to separate the different polarization modes in the time domain, according to an embodiment. For example, the s-polarized light and p-polarized light would be separated in time. The modulated light is represented by the black and white arrows following one after another along the optical path after the light has gone through modulator 702. The dynamic modulation occurring at modulator 702 may be controlled by a user, or provided via a program executed by a processing device (not shown). As such, according to an embodiment, a modulation reference signal 704 is generated by modulator 702 (or by a processing device that controls modulator 702). This modulation reference signal 704 is used to differentiate between the alternating polarization modes at detector 428. Modulation reference signal 704 may be received directly by detector 428 as shown, or by any processing device that controls detector 428.

Metrology system 700 may include one or more waveplates 705 in the path of the light around beam reflector 414, according to an embodiment. Waveplate 705 may be used to further rotate or change the polarization mode of the incoming light. For example, waveplate 705 provides linear, circular, or elliptical illumination onto substrate 420 or into interferometer 426. Any number of waveplates 705 may be used. Waveplate 705 may also be placed between beamsplitter 414 and substrate 420, and/or between beamsplitter 414 and interferometer 426.

Interferometer 426 interferes the diffracted light from substrate 420 to produce an output beam received by de-multiplexer 512. De-multiplexer 512 and detector 428 work in a similar way as described above in FIG. 5.

By using modulation reference signal 704, the light received at detector 428 can be separated into the different polarization states in the time domain. For example, signal 706 represents the s-polarized light while signal 708 represents the p-polarized light. The s-polarized light alternate in time with the p-polarized light as illustrated in the accompanying graphs showing a square-wave modulation applied to both polarizations. Note that these graphs are only exemplary. By being able to temporally separate the polarized states at detector 428, metrology system 700 does not need two interferometers (one for each polarization state).

It is not required that the light be continuous in metrology system 700. In another example, illumination system 701 produces pulsed light that is modulated at modulator 702 to separate the pulses in the time domain based on their polarization.

Figure 8:
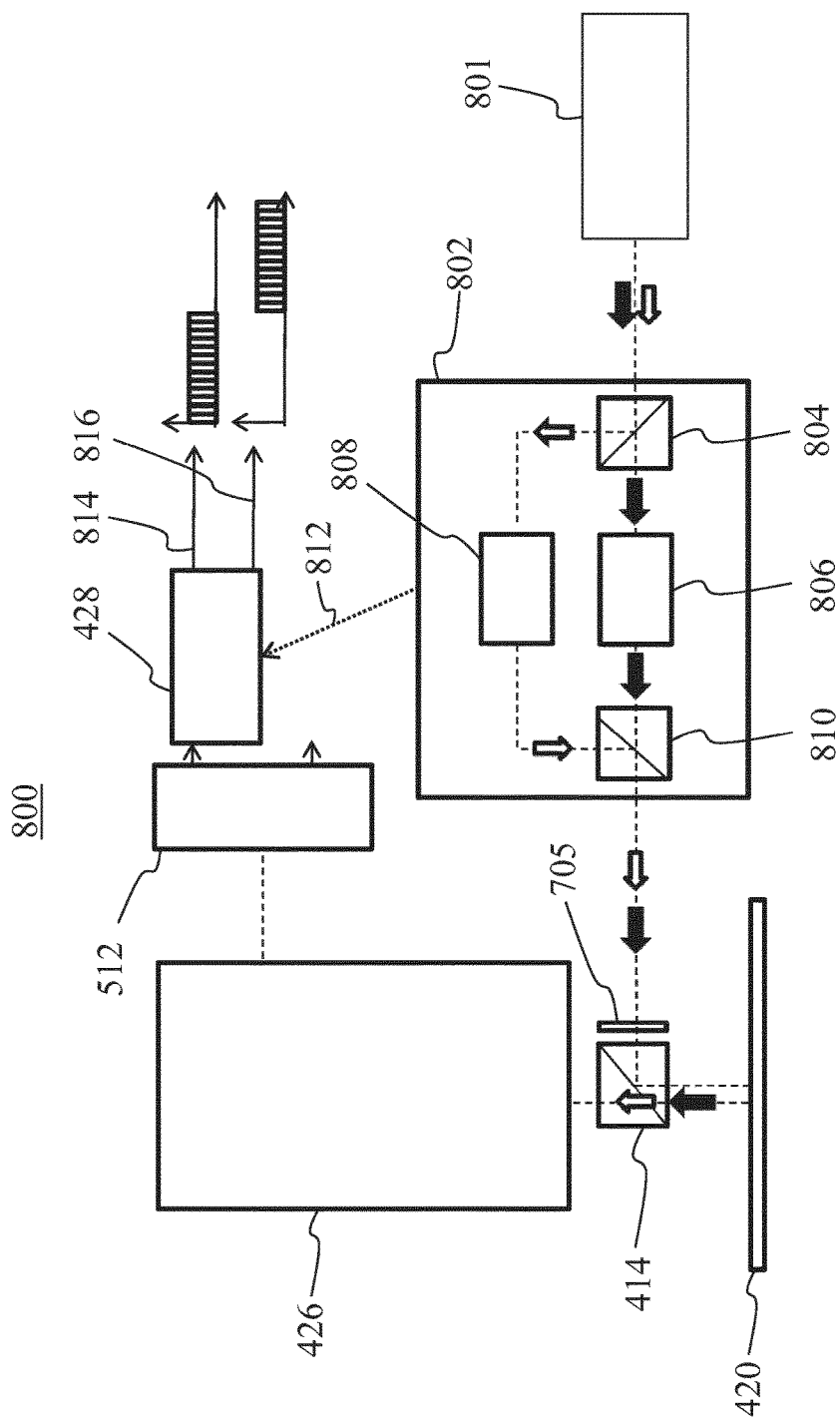

FIG. 8 illustrates a schematic of another metrology system 800 that can be implemented as a part of lithographic apparatus 100 or 100', according to an embodiment. Metrology system 800 is similar to metrology system 700, except that modulator 702 is replaced with a beam splitting modulator 802 that is designed to separately modulate each polarization state of the light. The dashed optical pathways between various elements of alignment system 800 may include free space optical components such as lenses and mirrors that help to guide the light. Light may also be directed along the optical pathways using one or more optical fibers.

Illumination system 801 may comprise a laser or bright LED source. The laser source may be a white laser source comprising a range of wavelengths in the visible spectrum. Other laser sources may be used that provide wavelengths in the near to mid-range infrared range. According to an embodiment, illumination system 801 provides continuous illumination.

The light generated from illumination system 801 is received by beam splitting modulator 802, according to an embodiment. Beam splitting modulator 801 includes a polarization beam splitter 804, a first modulator 806, a second modulator 808, and a combiner 810. Polarization beam splitter 804 directs light having a first polarization (e.g., p polarized) down a first path towards first modulator 806 and light having a second polarization (e.g., s polarized) down a second path towards second modulator 808, as indicated by the white and black arrows in FIG. 8.

Each of first modulator 806 and second modulator 808 are dynamic modulators including one or more electro-, thermo-, or acousto-optical modulators designed to modulate the incoming polarized light, according to an embodiment. For example, the s-polarized light is modulated by second modulator 808 and the p-polarized light is modulated by first modulator 806. Each polarized, modulated beam is then recombined at combiner 810. The modulation of each polarization state is designed such that the polarization states of the light are separated in the time domain once the light has been recombined at combiner 810. Combiner 810 may include a spot mirror or other partially reflective mirror. When using optical fibers, combiner 810 may include an evanescent coupler.

The dynamic modulation occurring at first modulator 806 and second modulator 808 may be controlled by a user, or provided via a program executed by a processing device (not shown). As such, according to an embodiment, a modulation reference signal 812 is generated by beam splitting modulator 802 (or by a processing device that controls beam splitting modulator 802). This modulation reference signal 812 is used to differentiate between the alternating polarization modes at detector 428. Modulation reference signal 812 may be received directly by detector 428 as shown, or by any processing device that controls detector 428.

The light exits beam splitting modulator 802 and continues through metrology system 800 all the way around to detector 428 as already described above with reference to FIG. 7.

By using modulation reference signal 812, the light received at detector 428 can be separated into the different polarization states in the time domain. For example, signal 814 represents the s-polarized light while signal 816 represents the p-polarized light. The s-polarized light alternates in time with the p-polarized light as illustrated in the accompanying graphs showing a square-wave modulation applied to both polarizations. Note that these graphs are only exemplary. By being able to temporally separate the polarized states at detector 428, metrology system 800 does not need two interferometers (one for each polarization state).

It is not required that the light be continuous in metrology system 800. In another example, illumination system 801 produces pulsed light that is modulated at beam splitting modulator 802 to separate and modulate the pulses in the time domain based on their polarization.

Spatial Polarization Separation Metrology Systems

Figure 9:
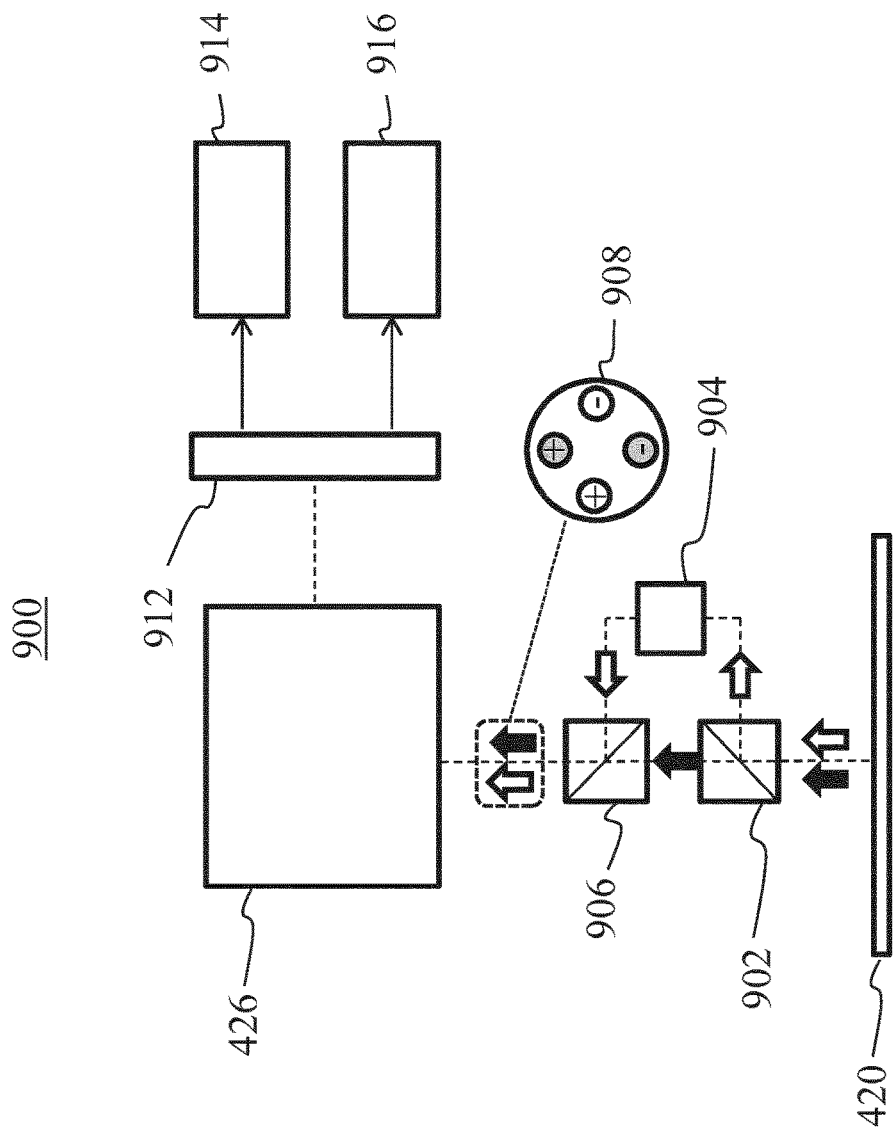
FIG. 9 is a schematic illustration of a metrology system that uses spatial polarization separation, according to an embodiment.

FIG. 9 illustrates a schematic of another metrology system 900 that can be implemented as a part of lithographic apparatus 100 or 100', according to an embodiment. Metrology system 900 differs from the embodiments illustrated in FIGS. 5-8 in that metrology system 900 separates different polarization modes spatially in the pupil plane, rather than in the time domain. The light refracted from the surface of substrate 420 is generated and directed towards substrate 420 in a similar way to that illustrated in FIG. 4. Illumination system 412 and reflector 414 are not shown in FIG. 6 for clarity. The dashed optical pathways between various elements of metrology system 900 may include free space optical components such as lenses and mirrors that help to guide the light. Light may also be directed along the optical pathways using one or more optical fibers.

Metrology system 900 may be an alignment system (e.g., measuring x-y position of features on a substrate) where the light is directed towards a substrate in substantially normal direction to a surface of the substrate, and the diffracted light in collected. Metrology system 900 may also be a height sensor (e.g., measuring z position of features on, or the surface of, the substrate. When used as a height sensor, metrology system 900 uses light incident at an angle above the surface of the substrate and collects the reflected light rather than diffraction.

Either pulsed or continuous light is diffracted or reflected from a target on the surface of substrate 420 and received by polarization beam splitter 902. Polarization beam splitter 902 may operate in substantially the same way as polarization beam splitter 506 from FIG. 5. Polarization beam splitter 902 directs light having a first polarization (e.g., p-polarized) down a first path towards combiner 906 and light having a second polarization (e.g., s-polarized) down a second path towards an optical rotator 904, as indicated by the white and black arrows in FIG. 9.

Optical rotator 904 includes optical components designed to rotate the received image in a pupil plane by a given amount. For example, optical rotator 904 includes a prism having a phase compensation coating to preserve the polarization mode of the light. The prism rotates the image of the light in the pupil plane by 90°, according to an embodiment. The desired rotation may be furnished by a number of different mirror or prism geometries. For example, a dove prism at 45° sandwiched between two 90° folds may be used. In another example, optical rotator 904 includes a 180° non-rotating fold and a dove prism placed in either the optical path of the s-polarized light or the optical path of the p-polarized light.

Combiner 906 combines the p-polarized light with the rotated s-polarized light. Upon recombination, the different polarizations are spatially separated in the pupil plane (e.g., the s-polarized light is rotated with respect to the p-polarized light.) Combiner 906 may include a spot mirror or other partially reflective mirror. When using optical fibers, combiner 906 may include an evanescent coupler.

Pupil plane diagram 908 illustrates the p-polarized light and s-polarized light in the pupil plane after the polarized light has been recombined at combiner 906, according to an embodiment. The p-polarized light is represented by the shaded circles (vertically aligned circles) while the s-polarized light is represented by the un-shaded circles (horizontally aligned circles.) In this example, the s-polarized light has been rotated by 90 degrees in pupil plane diagram 908 with respect to the p-polarized light. In another example, the gratings on substrate 420 are rotated by 45 degrees and the diffraction orders are also rotated by 45 degrees.

Interferometer 426 interferes the spatially separated light received from combiner 906 to produce an output beam received by one or more pupil dividers 912. Pupil dividers 912 include a plurality of reflecting and non-reflecting surfaces to separate the s-polarized light from the p-polarized light, according to an embodiment. The separated polarizations may then be directed towards different detectors. For example, two pupil dividers may be implemented to each feed two detectors (for a total of four detectors.) In the illustrated embodiment, a single pupil divider 912 is used to feed a first detector 914 and a second detector 916. First detector 914 may be designed to receive the s-polarized light while second detector 916 may be designed to receive the p-polarized light. By being able to spatially separate the polarized states and detect each spatially separated polarized state at a different detector, metrology system 900 does not need two interferometers (one for each polarization state).

Any of the metrology systems described in FIGS. 5-9 may be used to perform wavelength multiplexing/demultiplexing in addition to, or in place of, the polarization demultiplexing. The optical source in a given metrology system may be designed to output pulses having different wavelengths. The modulation applied to each wavelength may be different in order to distinguish one wavelength (or set of wavelengths) from another. In this way, the pulses can be differentiated from each other at the detector based on the modulation provided to different wavelengths.

Example Methods of Inspecting a Wafer Using a Metrology System

Figure 10:
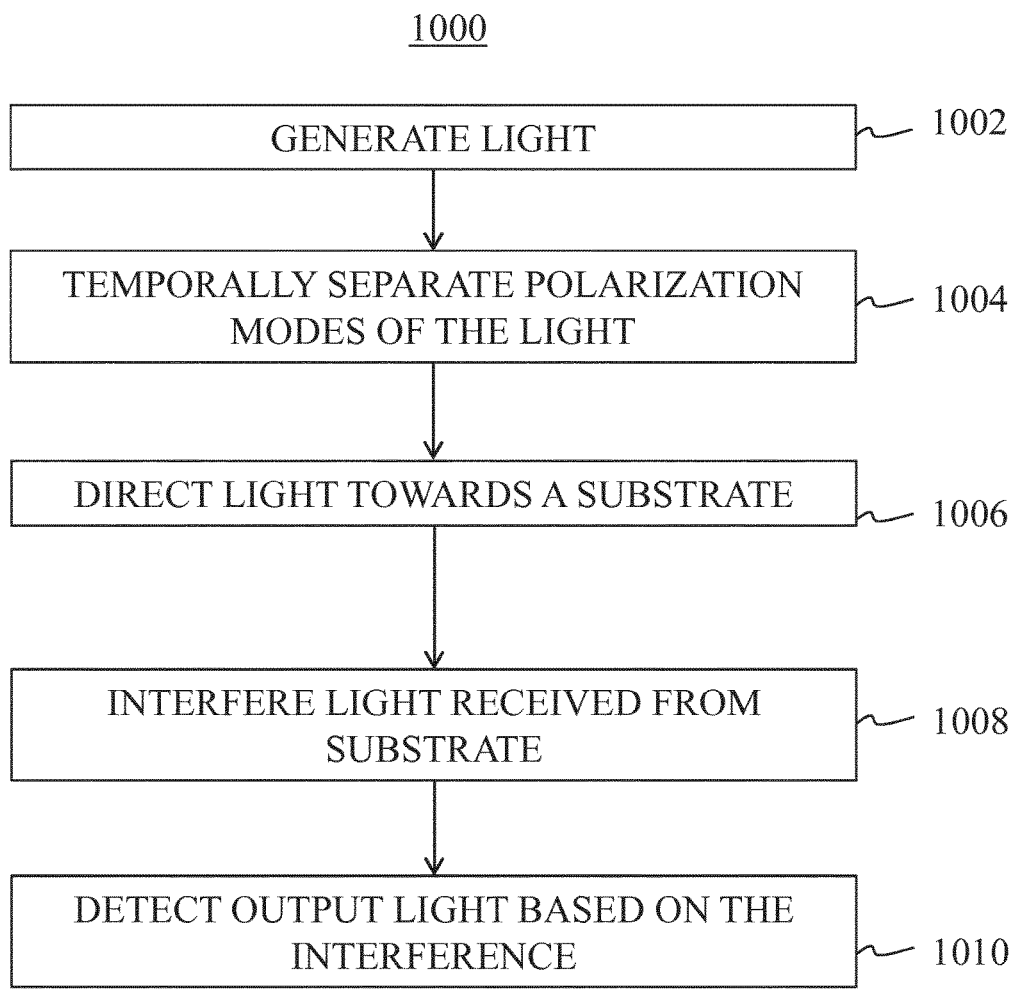
FIGS. 10-11 are flowcharts of methods for inspecting a wafer using a metrology system, according to various embodiments.

FIG. 10 illustrates a flowchart 1000 for using a metrology system to measure the position of a target on a substrate, or the height of the substrate surface, according to an embodiment. Solely for illustrative purposes, the steps illustrated in FIG. 10 will be described with reference to example operating environments illustrated in FIGS. 4-8. However, flowchart 1000 is not limited to these embodiments. It is to be appreciated that steps can be performed in a different order or not performed depending on specific applications.

In step 1002, light is generated from an illumination system. The generated light may be pulsed or continuous and may contain more than one polarization mode. Different wavelength intervals of the light may be modulated with temporally orthogonal amplitudes. The light may then be demodulated at the detector.

In step 1004, different polarization modes of the light are temporally separated (e.g., in the time domain), according to an embodiment. In another embodiment, different wavelengths of light may be temporally separated rather than (or along with) polarization modes. In another example, the polarization modes of the light are orthogonally modulated rather than temporally separated.

The polarization modes may be separated in time using a variety of techniques. For example, the polarization modes may be split using a polarization splitter. Then, one polarization mode is delayed with respect to the other polarization mode before the polarized light is combined. In another example, the light is modulated to temporally separate the polarization modes. In yet another example, the polarization modes are split using a polarization splitter. Then, each polarization mode is separately modulated before the polarized light is combined.

In step 1006, the light having temporally separated polarization modes is directed towards a substrate. In one example, the light is directed towards a target on the substrate and diffracts from the target. In another example, the light is reflected from a surface of the substrate in order to measure a height (Z-direction) of the substrate surface.

In step 1008, the light received from the substrate is interfered. In one example, diffraction orders of each polarization mode of light diffracted from a target on the substrate are interfered. For example, diffraction orders of the s-polarized light are interfered and diffraction orders of the p-polarized light are interfered. The interference may be performed by a self-referencing interferometer (SRI), such as interferometer 426. In another example, the reflected light from the substrate surface is interfered.

In step 1010, the output light from the interferometer is detected. The different polarization modes of the detected light are temporally separated, and thus can be differentiated from one another in the time domain at the detector, according to an embodiment. In another embodiment, the different wavelengths of light can be differentiated from one another in the time domain at the detector.

Figure 11:
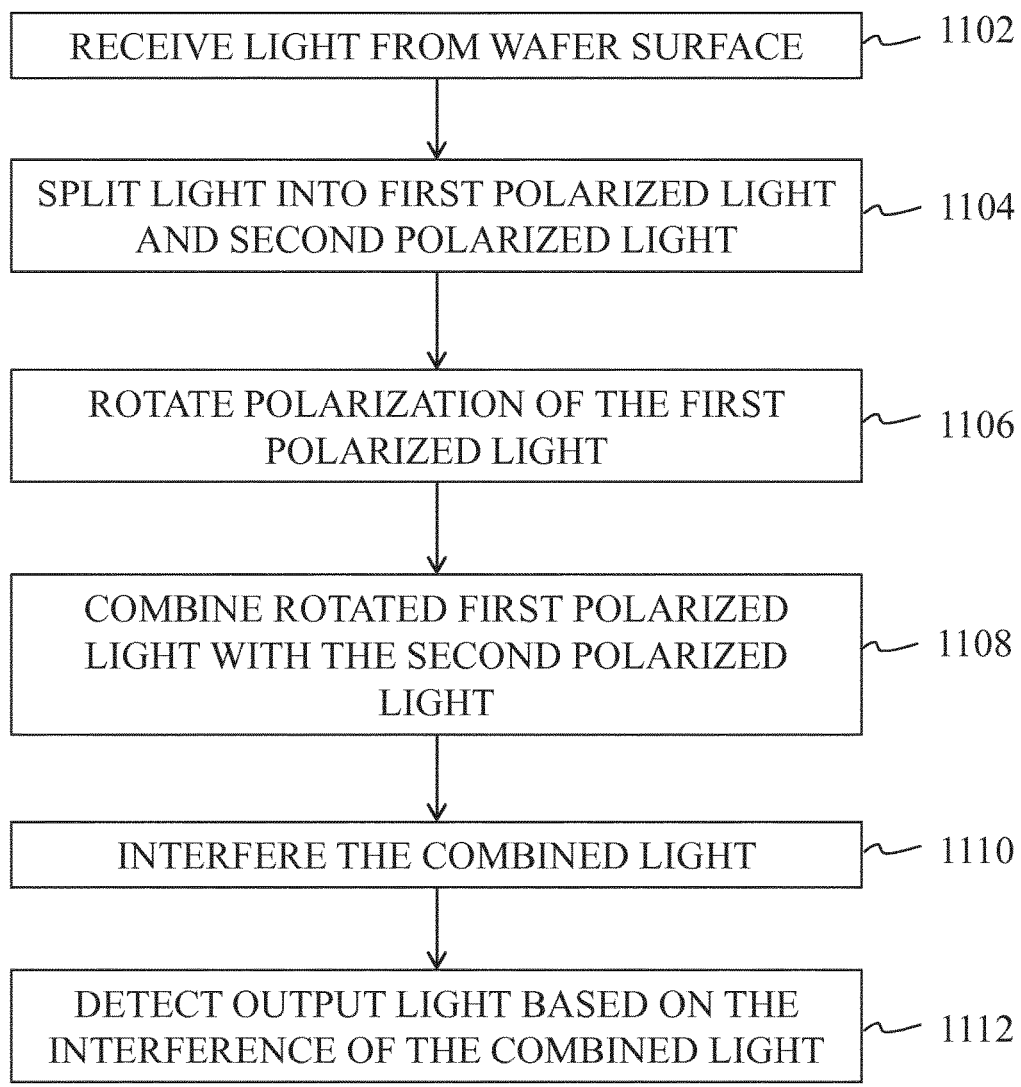

FIG. 11 illustrates a flowchart 1100 for using a metrology system to measure the position of a target on a substrate, or the height of the substrate surface, according to an embodiment. Solely for illustrative purposes, the steps illustrated in FIG. 11 will be described with reference to example operating environments illustrated in FIG. 9. However, flowchart 1100 is not limited to these embodiments. It is to be appreciated that steps can be performed in a different order or not performed depending on specific applications.

In step 1102, light is received from a substrate. The light may have been diffracted by a target on the substrate surface. In another example, the light has been reflected from the substrate surface. The light may have been generated and directed towards the substrate surface using an illumination system and reflector, such as those depicted in FIG. 4, for example. The received light may be pulsed or continuous and should contain more than one polarization mode.

In step 1104, the received light is split into first polarized light and second polarized light. For example, the light may be split into p-polarized light and s-polarized light. The light may be split using a polarization splitter, such as polarization splitter 902, for example.

In step 1106, the first polarized light is rotated in a pupil plane, according to an embodiment. The rotation may be performed using a prism that rotates the image of the light in the pupil plane. In one example, the first polarized light may be rotated by 90°.

In step 1108, the rotated first polarized light and the second polarized light are combined. Upon recombination, the different polarizations are spatially separated in the pupil plane (e.g., the s-polarized light is rotated with respect to the p-polarized light.)

In step 1110, diffraction orders of the combined light are interfered. The interference may be performed by a self-referencing interferometer (SRI), such as interferometer 426. In another example, the combined light is from reflection off the substrate surface, and the separated polarization modes of this combined light are interfered.

In step 1112, the output light from the interferometer is detected. The different polarization modes of the detected light are spatially separated in the pupil plane, and thus can be differentiated from one another using one or more pupil dividers, and directed towards one or more detectors for detecting the different light polarizations.

Final Remarks

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A metrology system, comprising:
   a radiation source configured to generate light;
   an optical modulator configured to temporally separate a first polarization mode of the light from a second polarization mode of the light;
   a reflector configured to direct the light towards a substrate;
   an interferometer configured to receive light that has been diffracted from a pattern on the substrate, or reflected from the substrate, and to produce output light from the interference between the diffracted or reflected light; and
   a detector configured to receive the output light from the interferometer, wherein the first polarization mode and the second polarization mode of the output light are temporally separated at the detector.

2. The metrology system of claim 1, wherein the optical modulator comprises:
   a polarization splitter configured to split the light into first polarized light having the first polarization mode and second polarized light having the second polarization mode;
   an optical delay element configured to change a group delay of the first polarized light; and
   an optical coupler configured to combine the first delayed polarized light and the second polarized light, such that the first polarization mode and the second polarization mode are temporally separated in the combined light.

3. The metrology system of claim 2, wherein the optical delay element comprises an optical fiber configured to increase an optical path length of the first polarized light.

4. The metrology system of claim 2, wherein the optical delay element comprises a plurality of mirrors configured to increase an optical path length for the first polarized light.

5. The metrology system of claim 2, wherein the optical modulator is configured to receive the light that has been diffracted or reflected from a pattern on the substrate and to transmit the combined light to the interferometer.

6. The metrology system of claim 2, wherein the radiation source comprises a pulsed laser source, and wherein the pulsed laser source is configured to output pulses having different wavelengths, and wherein the optical modulator is configured to apply a different modulation to the pulses based on their wavelength.

7. The metrology system of claim 1, wherein the radiation source comprises a continuous laser source.

8. The metrology system of claim 7, wherein the optical modulator is configured to receive light from the continuous laser source and temporally separate the first polarization mode from the second polarization mode received from the continuous laser source.

9. The metrology system of claim 8, wherein the optical modulator is further configured to transmit a signal to the detector, the signal being related to the temporal separation between the first polarization mode and the second polarization mode of the light.

10. The metrology system of claim 7, wherein the optical modulator comprises:
    a polarization splitter configured to split the light from the continuous laser source into first polarized light having the first polarization mode and second polarized light having the second polarization mode;
    a first optical modulator configured to apply a modulation to the first polarized light; and
    a second optical modulator configured to apply a modulation to the second polarized light,
    wherein the first modulation and the second modulation are applied such that the first polarization mode and the second polarization mode are temporally separated when the first polarized light and the second polarized light are recombined.

11. A lithographic apparatus, comprising:
    an illumination system configured to illuminate a pattern of a patterning device;

a projection system configured to project an image of the pattern onto a target portion of a substrate; and a metrology system comprising:

a radiation source configured to generate light;

an optical modulator configured to temporally separate a first polarization mode of the light from a second polarization mode of the light;

a reflector configured to direct the light towards a substrate;

an interferometer configured to receive light that has been diffracted from the pattern portion on the substrate, or reflected from the substrate, and to produce output light from the interference between the diffracted or reflected light; and a detector configured to receive the output light from the interferometer, wherein the first polarization mode and the second polarization mode of the output light are temporally separated at the detector.

12. The lithographic apparatus of claim 11, wherein the optical modulator comprises:

a polarization splitter configured to split the light into first polarized light having a first polarization mode and second polarized light having a second polarization mode;

an optical delay element configured to change a group delay of the first polarized light; and an optical coupler configured to combine the first delayed polarized light and the second polarized light, such that the first polarization mode and the second polarization mode are temporally separated in the combined light.

13. The lithographic apparatus of claim 12, wherein the optical modulator is configured to receive the first light that has been reflected from the pattern on the substrate and transmit the combined light to the interferometer.

14. The lithographic apparatus of claim 11, wherein the radiation source comprises a continuous laser source.

15. The lithographic apparatus of claim 14, wherein the optical modulator is configured to receive light from the continuous laser source and temporally separate a first polarization mode of the light from a second polarization mode of the light received from the continuous laser source.

16. The lithographic apparatus of claim 14, wherein the optical modulator comprises:

a polarization splitter configured to split the light from the continuous laser source into first polarized light having a first polarization mode and second polarized light having a second polarization mode;

a first optical modulator configured to apply a modulation to the first polarized light; and a second optical modulator configured to apply a modulation to the second polarized light, wherein the first modulation and the second modulation are applied such that the first polarization mode and the second polarization mode are temporally separated when the first polarized light and the second polarized light are recombined.

* * * * *